United States Patent
Rankin

(10) Patent No.: US 7,914,949 B2
(45) Date of Patent: Mar. 29, 2011

(54) METHOD FOR TESTING A PHOTOMASK

(75) Inventor: Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 1011 days.

(21) Appl. No.: 10/906,564

(22) Filed: Feb. 24, 2005

(65) Prior Publication Data

US 2006/0190196 A1 Aug. 24, 2006

(51) Int. Cl.
G03F 1/00 (2006.01)
(52) U.S. Cl. .......................................................... 430/5
(58) Field of Classification Search ........ 430/5; 716/21, 716/19
See application file for complete search history.

(56) References Cited

U.S. PATENT DOCUMENTS

| | | | | |
|---|---|---|---|---|
| 4,419,438 | A * | 12/1983 | Etoh et al. .................. | 430/275.1 |
| 6,472,108 | B1 * | 10/2002 | Lin .................................... | 430/5 |
| 6,559,662 | B1 * | 5/2003 | Yamada et al. ................ | 324/751 |
| 2002/0146865 | A1 * | 10/2002 | Hoel ............................. | 438/130 |
| 2003/0226980 | A1 * | 12/2003 | Kawashima ............... | 250/492.2 |
| 2003/0229880 | A1 * | 12/2003 | White et al. ..................... | 716/19 |
| 2004/0063000 | A1 * | 4/2004 | Maurer et al. ..................... | 430/5 |
| 2004/0086791 | A1 * | 5/2004 | Aoki et al. ..................... | 382/144 |
| 2004/0123266 | A1 * | 6/2004 | Egorov et al. ..................... | 716/21 |
| 2004/0170906 | A1 * | 9/2004 | Chen et al. ......................... | 430/5 |
| 2004/0267506 | A1 * | 12/2004 | Bowley et al. ................ | 702/189 |
| 2005/0003280 | A1 * | 1/2005 | Tsutsui et al. ..................... | 430/5 |
| 2005/0031976 | A1 * | 2/2005 | Kotani ............................ | 430/30 |

* cited by examiner

*Primary Examiner* — Stephen Rosasco
*Assistant Examiner* — Rashid Alam
(74) *Attorney, Agent, or Firm* — Robert A. Walsh; Daryl Neff

(57) ABSTRACT

A method, a recording medium and an apparatus for testing a photomask are provided. In the disclosed method, a particular region of a photomask is selected, either from a physical instance of the photomask, or from the photomask as represented by a digital representation thereof. The particular region is then characterized by identifying a pattern type present in the particular region. A lithographic process stress condition is determined for the particular region, considering the pattern type, and thereafter, a result of lithographically patterning a feature is determined by simulating a photolithographic exposure, using the particular region of the photomask under the lithographic process stress condition. Then, it is decided whether the particular region of the photomask is acceptable based on the result of the simulated exposure only under the lithographic process stress condition.

18 Claims, 3 Drawing Sheets

US 7,914,949 B2

METHOD FOR TESTING A PHOTOMASK

BACKGROUND OF THE INVENTION

The present invention relates to photolithography, and more particularly to the testing a photomask.

Processing to convert design data representing a layout into a photomask is an arduous and time-consuming process, as is the verification of a photomask after manufacture. In a typical process of designing an integrated circuit, a circuit designer creates a set of design data for a new circuit. The design data typically represents a set of elements interconnected to form circuits, which are interconnected to form functional units, which themselves make up an integrated circuit. Alternatively, the design data may represent a set of previously designed circuit blocks which are interconnected to form the functional units of the integrated circuit. Using several stages of processing, design data is converted to a set of "mask data" representing a photomask for printing the layout. The set of mask data can then be verified for conformity to a set of design rules and then processed for optical proximity correction ("OPC"). Alternatively, the initial mask data is immediately processed for OPC. The goal of OPC is to ensure that each feature of the layout can be printed acceptably with the mask, by correcting for the presence of nearby features of the mask that cause destructive and/or constructive interference as during the mask fabrication, and wafer lithography process. Through OPC, some features of the mask are increased in size, other features are decreased in size, and the placement and shape of certain features of the mask are changed. Like optical design rules checking, OPC is performed on a set of mask data prior to using the mask data to construct an actual physical mask. However, even after OPC, the features which appear in the mask data must be verified to be present on the mask, so that they can be printed acceptably on a substrate as features of a layout. Conventionally, some of this verification is performed as checking of the mask data against mask design rules. Sometimes, a computer has been used to perform simulations to determine the results of patterning the features of a layout represented by the mask data prior to using the mask data to prepare the physical mask, which is known as optical rules checking ("ORC").

In some prior art systems as noted above, ORC is used on a set of mask data prior to OPC processing to verify that the mask represented by the mask data will succeed in printing the features of a layout. However, there are several fundamental problems with this approach. First, ORC is only capable of detecting design problems. Second, the same mask data is used for simulation according to ORC that was generated during OPC, such that errors which are generated by OPC are not detected by ORC. A third problem is that the simulations required to perform sufficient ORC to verify the mask data for one mask consume much time and computing resources, and for that reason, are expensive to perform. Fourth, the trustworthiness of ORC in verifying mask data is continually subject to heightened scrutiny, because ORC is performed on mask data that does not represent actual feature patterns on a mask, as the mask production process introduces some non-ideality. In addition, systems capable of recognizing images and/or detecting defects using ORC are as yet in their infancy, and have difficulty discerning true problems from false calls.

Alternatively, after the mask is manufactured, its features can be verified by imaging the mask, either under actinic or non-actinic exposure conditions to obtain mask inspection data. The results of patterning features are then obtained by simulating lithographic processing in accordance with the mask as represented by the mask inspection data. However, in the past such simulations have been generally performed under a variety of lithographic process conditions including both "best" and "worst" lithographic exposure conditions and many conditions in between the best and worst conditions. A variety of conditions have to be simulated include different conditions for focus, dose, assumptions concerning the ideality of lenses, as well as assumptions concerning conditions achieved for substrates, photoresist films, lithography tools and other pertinent components of obtaining an exposure.

However, simulations under such conditions can consume much time and resources. Thus, computer simulations are typically performed with only a few of the conditions and components of the lithographic exposure being varied. However, if it is desired to perform more complete testing according to this algorithm to simulate all of the variable conditions and combinations of conditions of the lithographic exposure for a desired process window, dozens of simulations would be required for each location of the physical layout to be produced by the mask. In view of the millions of locations of a layout to be printed with a mask, it is evident that the task of simulating all combinations of the variable conditions of the lithographic exposure for the whole layout becomes impossible to perform using the limited computing resources and time that are normally allocated thereto. However, if any possible conditions are omitted, such testing can be inadequate to detect problems in the mask where the process window is unusually narrow. If such problem goes undetected prior to constructing the actual physical mask, then when the mask is constructed, the mask may be unusable, leading to potentially severe delays in manufacturing, and potentially causing unrecoverable loss of product revenue.

Moreover, the same concerns apply to computer-based simulations using actinic and/or non-actinic mask inspection data for determining mask defects and for verifying the printability of certain "designed images" of a layout. Again, it can be cost-prohibitive to perform computer-based simulation of all the combinations of variable lithographic exposure conditions to determine mask defects for all of the locations of a layout and to verify printability of designed images.

Accordingly, it would be desirable to provide an improved method of testing a photomask which can be used to more readily verify the performance of the photomask, which has the potential to require much less computing resources and/or time to perform than the conventional approaches discussed above.

SUMMARY OF THE INVENTION

According to an aspect of the invention, a method is provided for testing a photomask or a photomask design as contained in a digital representation of the photomask. A particular region of a photomask is selected, and is characterized by identifying a pattern type present in the particular region. A lithographic process stress condition is determined for the particular region in consideration of the pattern type. Thereafter, a result of lithographically patterning a feature is determined by simulating a photolithographic exposure, using the particular region of the photomask under the lithographic process stress condition. Then, it is decided whether the particular region of the photomask is acceptable based on the result of the simulated exposure only under the lithographic process stress condition.

Preferably, the method further includes selecting another region of the photomask as the particular region and repeating the steps of determining a lithographic process stress condition and determining a result of patterning a feature by simulating the lithographic exposure under the lithographic process stress condition. This is preferably done until results of patterning in accordance with all regions of the photomask have been determined. Then, it is decided whether the photomask is acceptable based on the results of patterning in accordance with all regions of the photomask.

According to an even more preferred aspect of the invention, when by the step of determining the result of patterning the feature is not acceptably patterned, additional steps are performed of incrementally improving the lithographic process stress condition, determining a result of lithographically patterning the feature under the improved lithographic process condition, and determining whether that result is acceptable. According to a particular preferred aspect of the invention, the additional steps are repeated until the feature is acceptably patterned. In such case, the method may further include recording the last improved lithographic stress condition until the feature is acceptably printed. In a particular embodiment in such case, an overall process window for the mask is reported based on the results of the simulated patterning of all regions of the mask.

DETAILED DESCRIPTION

According to the embodiments of the invention described herein, a method, a recording medium and an apparatus for testing a photomask are provided. In the disclosed method, a particular region of a photomask is selected. The particular region is characterized by identifying a pattern type present in the particular region. A lithographic process stress condition is determined for the particular region in consideration of the pattern type, and thereafter, a result of lithographically patterning a feature is determined by simulating a photolithographic exposure, using the particular region of the photomask under the lithographic process stress condition. Then, it is decided whether the particular region of the photomask is acceptable based on the result of the simulated exposure only under the lithographic process stress condition. Preferably, these steps are performed for all of the regions of the mask. Defects are reported when the results of patterning a particular feature by one of the simulated lithographic exposures are not acceptable. A decision concerning the acceptance of the mask can be made based on the prior results of patterning performed in accordance with the various regions of the mask. Thus, because lithographic exposures only need to be simulated under a lithographic process stress condition for each particular region of the mask, a determination can be made concerning the acceptance of the mask in a method which consumes much less time and/or resources as in the above-described methods in which each region is tested for a whole range of simulated lithographic process conditions.

The simulation is preferably performed for a lithographic process stress condition defined by setting a condition of the photolithographic exposure to a process tolerance limit. For example, the simulation can be performed under one or more conditions which can be considered "worst-case conditions". Under worst case conditions, one or more of the focus, dose and assumptions concerning lens aberrations are set to values which are at the limit of a process tolerance at which effects tend to be most prominent.

Figure 1:
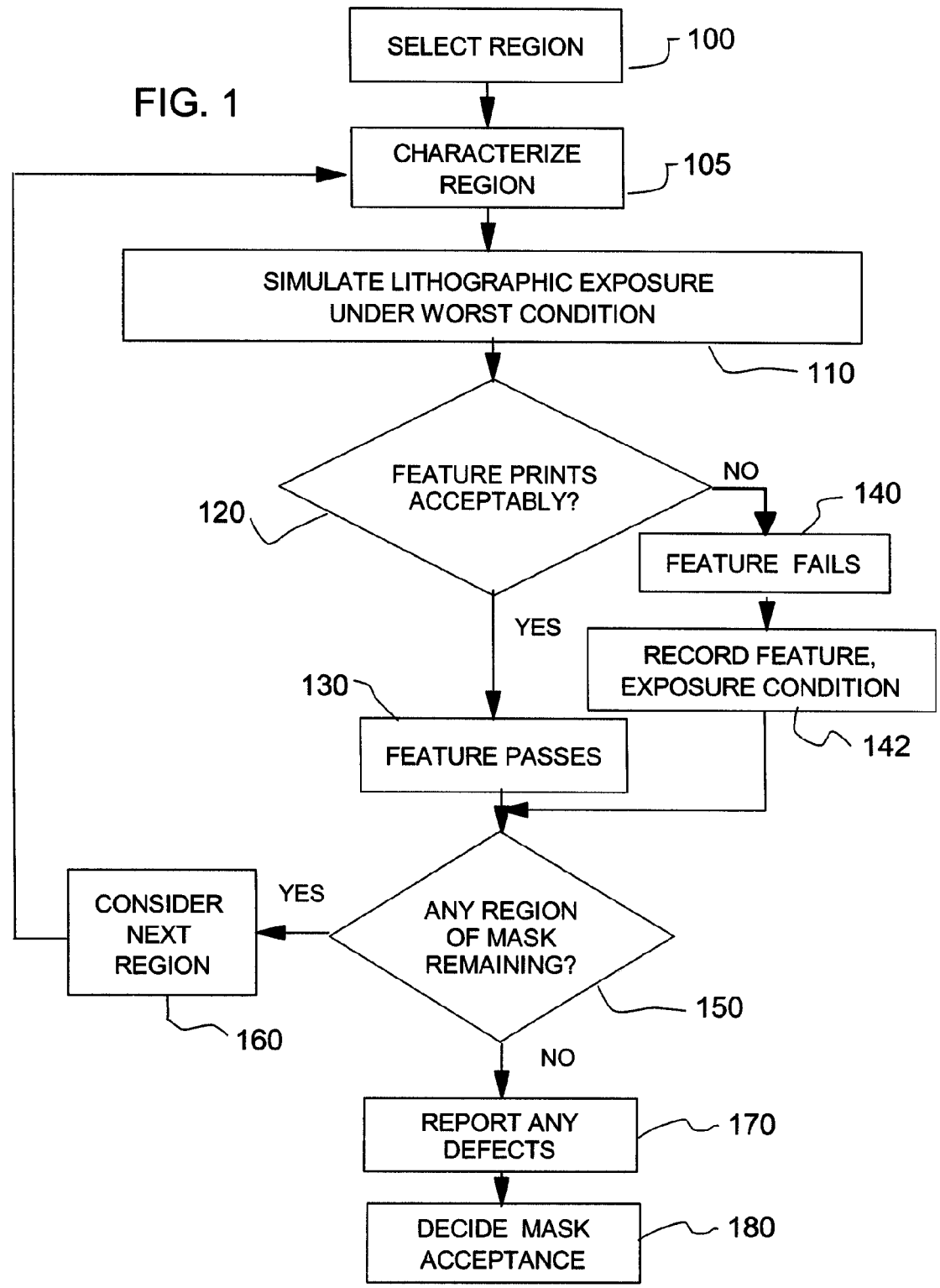
FIG. 1 is a flowchart illustrating a method of testing a photomask in accordance with a first embodiment of the invention.

A first embodiment of the invention will now be described with reference to FIG. 1. As shown therein, in an initial stage (100) of processing, a particular region of the mask is selected for testing. At this point, inspection data obtained by imaging an actual photomask can be used. Alternatively, a digital representation of a mask is used, i.e., data specifying a mask, the data being of the type from which a physical instance of the mask can be manufactured. In stage 105, the selected region is characterized by determining a type of pattern that is present within the particular region. Generally, either the most prevalent type of pattern within the particular region or the type of pattern most prone to difficulty in printing under lithographic process stress is selected for the characterization. Based on the characterization, a worst case condition is selected for the type of pattern and used during a simulated lithographic expose with the particular region of the mask. Here, the worst case condition varies according to the characterization given to the particular region. For example, the worst case condition varies depending on whether the characterization is that the particular region contains nested lines, isolated lines, or a particular type of pattern, e.g., a corner at the intersection of two lines, or perhaps an end of a line pattern. Such exemplary features can vary in their difficulty of patterning under different process conditions due to factors in the lithographic exposure: e.g., due to constructive and destructive optical interference brought about by optical proximity, for example.

Once the region has been characterized, at stage 110 a condition of the lithographic exposure is set to a limit of the process tolerance, in order to test the ability to print one or more features in the particular region under a "worst case" condition of the process window for such feature. For example, one or more process conditions such as focus, dose and lens aberration are set to values which are at a limit of the respective process tolerance. The process condition is also set to that which is worst in light of the overall integrated processing scheme and the characteristics of the specific features to be patterned by that region of the mask. For example, if the pattern type of the particular region is an isolated line, and a correct positive feature of the mask is used to pattern a correct positive photoresist, a positive focus is applied to place the greatest stress condition on the lithographic exposure. In this example, a "correct positive feature" of a mask refers to a opaque (chrome) pattern of the mask corresponding to the feature which is to remain in the photoresist layer after patterning. A "correct positive photoresist" refers to that corresponding type of photoresist in which the portions of the photoresist layer that are not illuminated during the lithographic exposure (because they correspond to the shadows cast by the mask) are those which remain after the exposed photoresist layer is developed. "Positive focus" refers to setting the focal plane to a height above the surface of the photoresist layer, i.e., closer towards the mask.

Thus, when the pattern type is an isolated line, the lithographic exposure condition is selected to be at the limit of the process tolerance for positive focus, because that is the condition which is worst within the stated process window, given the specific manner in which the lithographic exposure is to be made. As another example, when the pattern type of the selected region is a small, isolated transparent feature, i.e., such as a phase-shifting feature of the mask, the exposure is set to the process tolerance limit for negative focus, because negative focus is often the worst exposure condition for patterning such small isolated transparent feature.

In other examples, when the pattern type is a set of lines which run in a "vertical" (i.e., up-down or north-south) direction along a substrate, the exposure condition is set to a corresponding worst case condition such as positive lens astigmatism. Likewise, when the pattern type is a set of lines which run in a "horizontal" (i.e., side-to-side or east-west) direction along the substrate, the exposure condition is set to a corresponding worst case condition such as negative lens astigmatism.

Once the lithographic exposure has been simulated for the particular region of the mask, at stage 120 it is determined whether a feature is printed acceptably by the region of the mask. During this stage, the determination is preferably made in view of predetermined acceptance criteria, i.e., those which are determined in advance for a given photolithography technology and generation. In one embodiment, the acceptance criteria relate to the length, width and shape of the feature and possible rotation of the feature which is created by the lithographic exposure. Another criterion such as adequacy of the exposure in creating a sufficiently durable feature may be used instead of or in addition to the above criteria. If the result of the lithographic patterning is that the feature fails to print acceptably, then it is concluded (140) that the feature fails. The feature and the lithographic exposure condition at which it failed are then recorded (142) for use in reporting defects in the mask (170), as will be described below. Otherwise, if the feature is printed acceptably under the worst case condition, the feature is determined to be passing (130).

Ordinarily, the above steps are repeated for every region of the mask until the mask has been completely simulated. Accordingly, at stage 150, it is determined whether there is any region of the mask which is yet to undergo patterning via simulated lithographic exposure. If there is, a new particular region is selected at stage 160. The process is performed again from stage 105 by characterizing the newly selected particular region, then determining a lithographic process stress condition for the newly selected region and simulating the lithographic exposure condition for that region in a manner as described above. Thus, the process of selecting a new particular region and simulating the lithographic exposure to determine a result of patterning a feature continues until there are no more regions of the mask to be tested.

Based on the results of all of the testing, any defects found by the testing are reported (170). In addition, at stage 180, a decision can be made as to whether to accept the mask based upon the results of simulating the lithographic exposure for one or more of the regions of the mask. For example, a decision is reached that the mask is not acceptable when for any of the various regions of the mask a feature fails to print acceptably. In a particular embodiment, additional simulations may need to be performed, as described below with reference to FIG. 2, in order to determine whether the problem can be resolved by tightening the process window. Alternatively, additional simulations can be performed to gather data to assist in determining the cause of the problem, and determining how best to resolve the problem, as by regenerating the mask data or by repairing the mask according to known methods, such as laser ablation or carbon deposition.

Note that a mask usually contains several different types of features which pose difficulties in printing such as those described above. For each such type of feature, the process window for obtaining the lithographic exposure may become narrower than allocated by the design and the manufacturing requirements. According to this embodiment of the invention, it is preferable to determine the result of patterning each such type of feature in order to decide whether the mask as a whole passes acceptance or fails.

Figure 2:
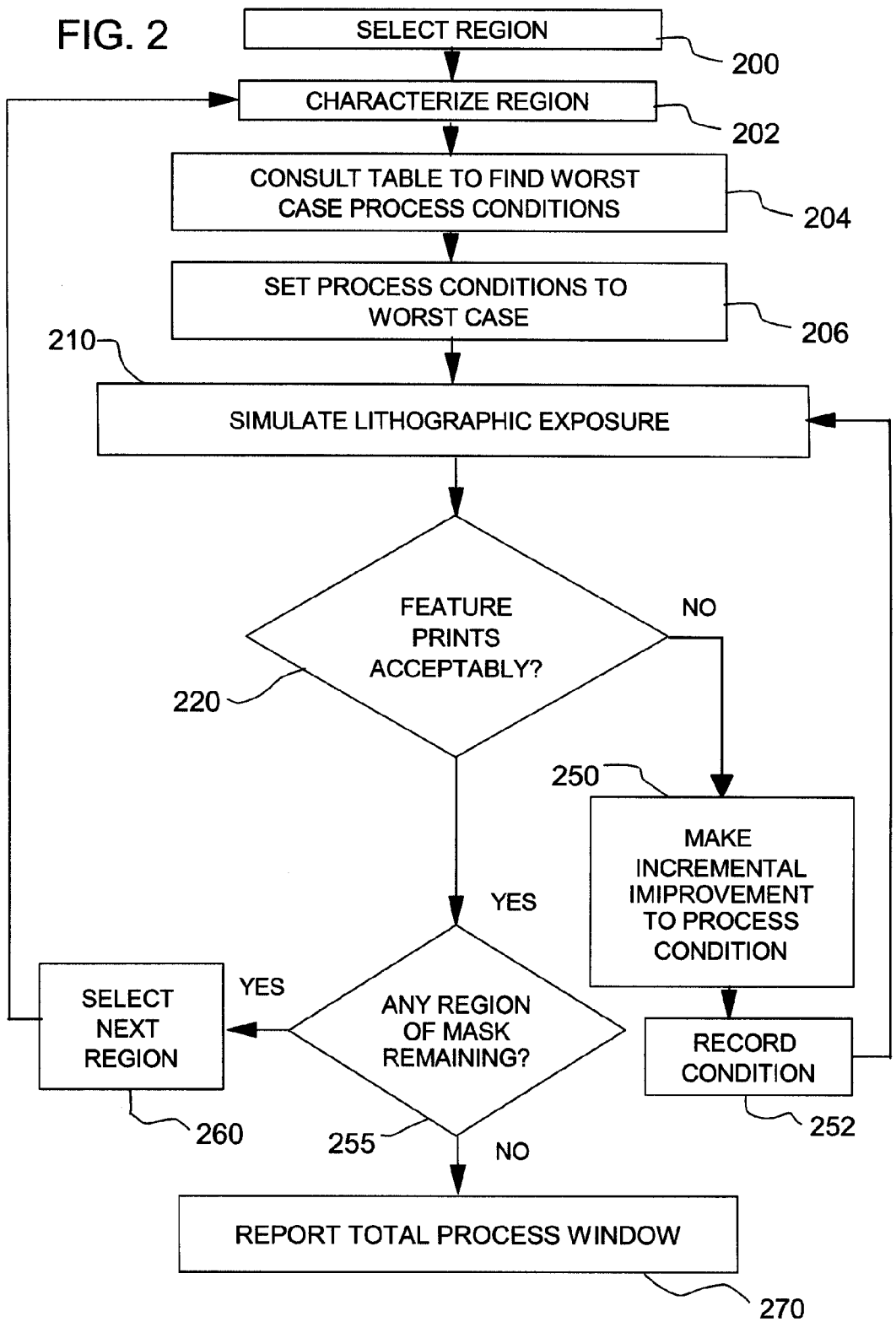
FIG. 2 is a flowchart illustrating a preferred method of testing a photomask in accordance with a second embodiment of the invention.

FIG. 2 illustrates a particular preferred method performed in accordance with a second embodiment of the invention. As shown therein, stages 200 and 202 are the same as stages 100 and 105 shown and described above with reference to FIG. 1. In step 202, the pattern type of the particular region is identified, such as through pattern recognition when dealing with mask inspection data. Alternatively, when the mask is represented by a digital representation, the pattern type is determined through data specifying the mask, e.g., through data contained in the digital representation.

As further provided in FIG. 2, at stage 204, information contained in a look-up table, for example, is consulted to determine one or more worst case lithographic exposure conditions for simulating the patterning of the wafer that would take place in accordance with the particular region of the mask. In stage 206, a condition of the lithographic exposure, e.g., such as focus, dose, lens aberration, etc., is set to a worst case condition. In other words, the exposure condition is set to the limit of the process tolerance which is most likely to affect patterning result for the type of feature being patterned by that region of the mask. Then, at stage 210, a computer-based simulation is performed in order to determine the result of patterning the feature. The simulation is performed in a manner such as described above with reference to FIG. 1. If the feature prints acceptably, at stage 220 it is determined whether there is any other region remaining to be tested. If so, the new region is selected (260) and is used again in the above-described method.

However, when the feature fails to print acceptably, one or more further simulated lithographic exposures are made to determine an outer boundary or boundaries at which the feature prints acceptably. Ultimately, such further exposures are used to help determine an overall process window for the mask, as will be described further below relative to stage 270. To do this, at stage 250, an incremental improvement is made to the lithographic process condition for the particular region for which a feature failed to print. Essentially, this involves backing away stepwise from the worst case lithographic process condition by an incremental step. At stage 252, the incrementally improved condition is recorded for future reference. Then, at stage 210, the lithographic exposure is simulated again and it is determined whether the feature present in the particular region prints acceptably (220). If the feature still fails to print acceptably, the stages 250 and 252, 210 and 220 are repeated again to determine whether a further incremental improvement, if available, will allow the feature to print acceptably. The process condition is improved incrementally each time the simulated exposure condition is performed. When the failing feature finally does print acceptably, the exposure condition last recorded at stage 252 indicates the condition at which the feature is just capable of being acceptably printed. This then indicates a worst case lithographic process condition under which the particular region can be acceptably patterned.

After going through such simulated lithographic exposures for all of the regions of the mask, i.e., by selecting a new region (260) and going through the above-described steps for each new region of the mask, a set of test data will be obtained for the entire photomask. Based on the results of the above simulated exposures, at stage 270, a total process window is determined for the mask which indicates a process window at which features of the mask print acceptably, and beyond which at least one or more features of the mask does not print acceptably. From this a decision can be made whether or not the mask is acceptable for use for its intended purpose. Alternatively, when a determination is made that the mask is not acceptable, the performance of the additional simulation of a failing feature helps to determine what changes may need to be made to correct the mask or the design to improve the overall process window.

Figure 3:
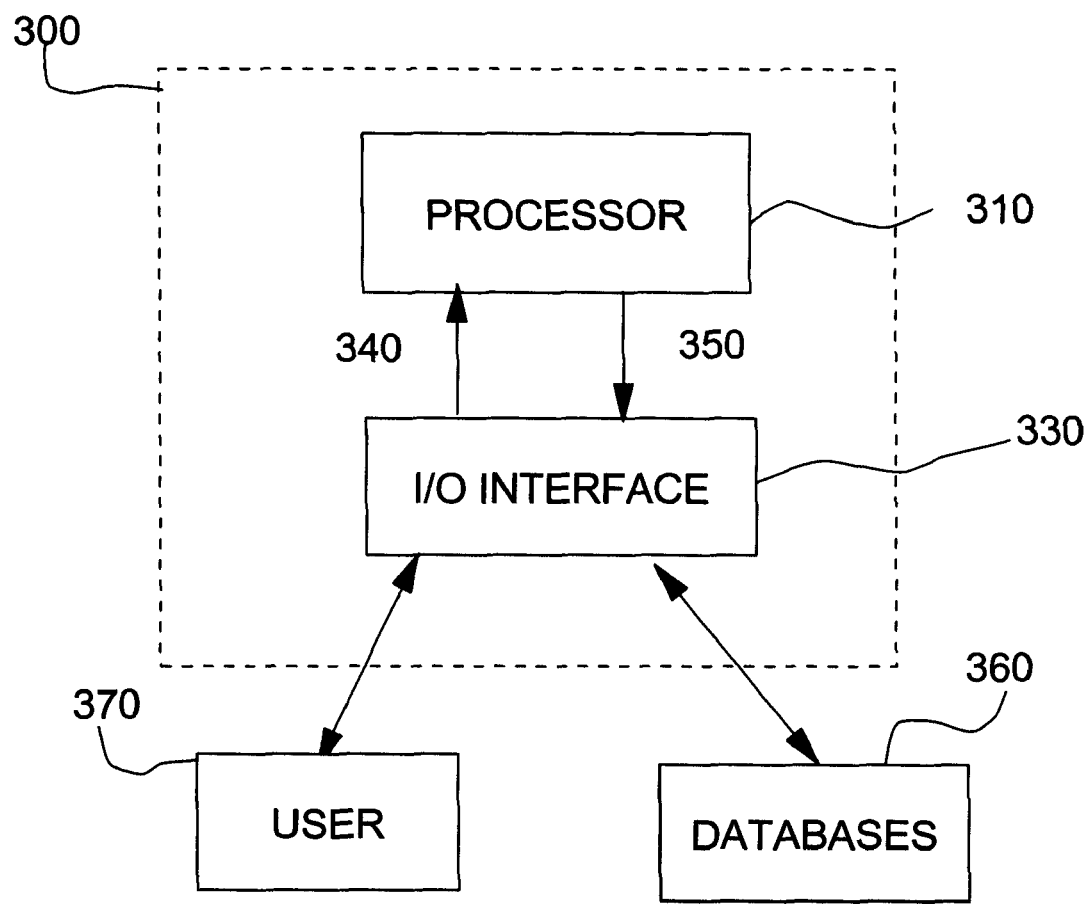
FIG. 3 is a block diagram illustrating a system for testing a photomask in accordance with an embodiment of the invention.

FIG. 3 illustrates a system operable to perform a method of testing photomask data according to an embodiment of the invention. As shown in FIG. 3, the system includes a central processing unit (CPU) 310 provided with a memory 310. The CPU 310 may include a single processor or a plurality of processors arranged to execute instructions of a program in a parallel or semi-parallel manner. An input output (I/O) interface 330 is provided for inputting a program including instructions and data for performing a method such as that described above with reference to FIG. 1 or 2 to the CPU 310 and for outputting the results of executing a program. The I/O interface 330 preferably includes one or more types of interfaces to removable digital storage media such as a magnetic disk, magneto-optic disk, read/write and/or read only optical disc, digital tape, removable disk drive and/or removable solid state memory such as a portable memory card. In addition to or in place thereof, the I/O interface preferably includes a network interface such as a modem or network adapter card for permitting transfer of information to and from a network. The I/O interface 330 may also include a display for outputting information to and/or inputting information from a user 370. The I/O interface 330 may additionally include one or more user interface devices such as a keyboard, mouse, speaker, joystick, scanner, printer, etc. and the like. To the extent that any of the above-described types of removable storage media are present at the I/O interface, a program containing a set of instructions that is stored in such removable storage medium can be transferred as input 340 between the I/O interface 330 and the CPU 310. In addition to the program, a set of data, e.g., mask inspection data and/or a digital representation of a mask and other data, to be operated upon by the instructions are also input over the I/O interface 330, e.g. from databases 360. Once the program and the data set to be operated upon have been loaded into the CPU 310, the CPU then executes the set of instructions of the program relative to the data and provides output 350 to the I/O interface 330 connected thereto.

In an embodiment, a program containing instructions for performing a method according to an embodiment of the invention is stored on one or more removable storage media to be provided to the I/O interface 330 and loaded into the CPU 310. Alternatively, the program containing the instructions is transferred from a storage medium such as a memory of one or more computers or other storage devices of a network to a modem, network adapter or other device of the I/O interface 330 and further transferred therefrom to the CPU 310. After the CPU 310 receives and loads the program into memory, the program is then executed relative to the set of data provided to the CPU 310. In such way, an apparatus for testing a photomask is implemented and a method of testing a photomask can be performed according to an embodiment of the invention.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of testing a photomask, comprising:
   a) selecting a particular region of a photomask;
   b) identifying a pattern type present in the particular region to characterize the particular region;
   c) determining a lithographic process stress condition for the particular region, considering the pattern type;
   d) determining a result of lithographically patterning a feature by simulating a photolithographic exposure using the particular region of the photomask under the lithographic process stress condition; and
   e) deciding whether the particular region of the photomask is acceptable based on the result of the simulated exposure only under the lithographic process stress condition.

2. The method as claimed in claim 1, wherein the lithographic process stress condition is defined by setting a condition of the photolithographic exposure to a process tolerance limit.

3. The method as claimed in claim 2, wherein the condition of the photolithographic exposure includes at least one of a focus, a dose, a mask height, a resist thickness, and a lens aberration.

4. The method as claimed in claim 1, further comprising selecting another region of the photomask as the particular region and repeating steps b), c) and d) until results of patterning with all regions of the photomask have been determined and deciding whether the photomask is acceptable based on the results of patterning with all regions of the photomask.

5. The method as claimed in claim 1, wherein the lithographic process stress condition is determined by using the identified pattern type to reference a table.

6. The method as claimed in claim 1, wherein the lithographic process stress condition is a worst case process condition for the identified pattern type.

7. The method as claimed in claim 1, wherein the lithographic exposure is simulated using inspection data obtained by imaging the mask.

8. The method as claimed in claim 7, wherein the inspection data includes data selected from the group consisting of actinic and non-actinic inspection data.

9. A method of testing a digital representation of a photomask usable to construct a physical instance of the photomask, comprising:
   a) selecting a particular region of the photomask as represented by the digital representation;
   b) identifying a pattern type present in the particular region to characterize the particular region;
   c) determining a lithographic process stress condition for the particular region, considering the pattern type;
   d) determining a result of lithographically patterning a feature by simulating a photolithographic exposure using the particular region of the photomask under the lithographic process stress condition; and
   e) deciding whether the particular region of the photomask is acceptable based on the result of the simulated exposure only under the lithographic process stress condition.

10. The method as claimed in 9, wherein the digital representation has not been corrected for optical proximity prior to simulating the lithographic exposure.

11. The method as claimed in 9, wherein the digital representation has been corrected for optical proximity prior to simulating the lithographic exposure.

12. The method as claimed in claim 4, wherein, when by the determining step d) the feature is not acceptably patterned, performing the steps of f) incrementally improving the lithographic process stress condition, g) determining a result of lithographically patterning the feature under the improved lithographic process condition, and h) determining whether that result is acceptable.

13. The method as claimed in claim 12, further comprising repeating the steps f), g) and h) until the feature is acceptably patterned.

14. The method as claimed in claim 13, further comprising i) recording the last improved lithographic stress condition until the feature is acceptably printed.

15. The method as claimed in claim 14, further comprising using the results of patterning with all regions of the mask to report an overall process window for the mask.

16. A method of testing a photomask, comprising:
   a) for a photomask having a plurality of individual particular regions, selecting a particular region of a photomask and identifying a pattern type present in the selected particular region to characterize the selected particular region;
   b) selecting a photolithographic exposure condition being a lithographic stress condition for printing the identified pattern type and being dependent upon the identified pattern type;
   c) determining a result of lithographically patterning a feature having the identified pattern type by simulating a photolithographic exposure using the selected particular region of the photomask under the lithographic process stress condition;
   d) deciding whether the selected particular region of the photomask is acceptable based on the result of the simulated exposure;
   e) selecting another particular region from among the plurality of individual regions of the photomask and identifying a pattern type present in the another particular region to characterize the another particular region; and
   f) repeating steps (c) and (d) using the another selected particular region as the selected particular region.

17. The method as claimed in claim 16, wherein the photolithographic exposure condition includes at least one of a focus, a dose, a mask height, a resist thickness, and a lens aberration.

18. The method as claimed in claim 17, wherein the lithographic exposure is simulated using inspection data obtained by imaging the mask, the inspection data being selected from the group consisting of actinic and non-actinic inspection data.

* * * * *